United States Patent
Fukunaga et al.

(10) Patent No.: US 10,892,359 B2
(45) Date of Patent: Jan. 12, 2021

(54) SEMICONDUCTOR DEVICE

(71) Applicant: Sanken Electric Co., Ltd., Niiza (JP)

(72) Inventors: Shunsuke Fukunaga, Niiza (JP); Taro Kondo, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 0 days.

(21) Appl. No.: 16/344,825

(22) PCT Filed: Oct. 27, 2016

(86) PCT No.: PCT/JP2016/081930
§ 371 (c)(1),
(2) Date: Apr. 25, 2019

(87) PCT Pub. No.: WO2018/078776
PCT Pub. Date: May 3, 2018

(65) Prior Publication Data
US 2019/0252543 A1 Aug. 15, 2019

(51) Int. Cl.
*H01L 29/78* (2006.01)
*H01L 27/088* (2006.01)
*H01L 29/06* (2006.01)
*H01L 29/40* (2006.01)

(52) U.S. Cl.
CPC ........ *H01L 29/7813* (2013.01); *H01L 27/088* (2013.01); *H01L 29/06* (2013.01); *H01L 29/407* (2013.01); *H01L 29/78* (2013.01)

(58) Field of Classification Search
CPC combination set(s) only.
See application file for complete search history.

(56) References Cited

U.S. PATENT DOCUMENTS

| | | | |
|---|---|---|---|
| 6,351,018 B1* | 2/2002 | Sapp | H01L 29/7813 257/499 |
| 2005/0167742 A1 | 8/2005 | Challa et al. | |
| 2012/0217540 A1* | 8/2012 | Hirler | H01L 29/66727 257/133 |
| 2016/0043000 A1* | 2/2016 | Rieger | H01L 29/42364 257/334 |
| 2016/0064547 A1 | 3/2016 | Siemieniec et al. | |
| 2016/0079238 A1* | 3/2016 | Siemieniec | H02M 3/33576 257/140 |
| 2016/0141400 A1* | 5/2016 | Takahashi | H01L 29/0834 257/140 |
| 2020/0168719 A1* | 5/2020 | Liu | H01L 29/7813 |

FOREIGN PATENT DOCUMENTS

JP   2007-529115 A   10/2007

* cited by examiner

*Primary Examiner* — Galina G Yushina
(74) *Attorney, Agent, or Firm* — Metrolex IP Law Group, PLLC

(57) ABSTRACT

A semiconductor device includes: a semiconductor base 10 in which a first trench 101 is formed in a mesh-like shape in a plan view and a second trench 102 is formed in a mesh opening surrounded by the first trench 101; a first semiconductor element 1 which is formed in the semiconductor base 10 and includes a first gate electrode 81 provided within the first trench 101; and a second semiconductor element 2 which is formed in the semiconductor base 10 and includes a second gate electrode 82 provided within the second trench 102 surrounded by the first gate electrode 81.

9 Claims, 5 Drawing Sheets

-- PRIOR ART --

# SEMICONDUCTOR DEVICE

TECHNICAL FIELD

The present invention relates to a semiconductor device with a trench gate structure.

BACKGROUND ART

In a semiconductor device that includes semiconductor elements integrated, cells in which the semiconductor elements such as transistors are arranged can be miniaturized as a method to increase the switching speed thereof. However, miniaturization of cells reduces the area of the gate electrode of each transistor, thus increasing the gate resistance. If the gate electrode is made of a metallic material, the gate resistance is reduced. However, the metallic material diffuses from the gate electrode through the gate insulating film into the semiconductor layer to change the characteristics.

Semiconductor devices are therefore being studied in terms of various structures. Patent Literature 1 discloses a method to improve the tradeoff between switching speed and on-state resistance in a structure including first and second vertical field plates by making the first and second gate electrodes of different materials.

CITATION LIST

Patent Literature

[PTL 1] U.S. Unexamined Patent Application No. 2016/0043000 Specification

SUMMARY OF INVENTION

Technical Problem

However, semiconductor devices are being demanded to have the on-state resistance further reduced and the avalanche capability further improved. An object of the present invention is to provide a semiconductor device with the on-state resistance reduced and the avalanche capability improved.

Solution to Problem

According to an aspect of the present invention, a semiconductor device is provided, which includes: a semiconductor base in which a first trench is formed in a mesh-like shape in a plan view and a second trench is formed in a mesh opening surrounded by the first trench; a first semiconductor element which is formed in the semiconductor base and includes a first gate electrode provided within the first trench; and a second semiconductor element which is formed in the semiconductor base and includes a second gate electrode provided within the second trench surrounded by the first gate electrode.

Advantageous Effects of Invention

According to the present invention, it is possible to provide a semiconductor device with the on-state resistance reduced and the avalanche capability improved.

DESCRIPTION OF EMBODIMENTS

Figure 1:
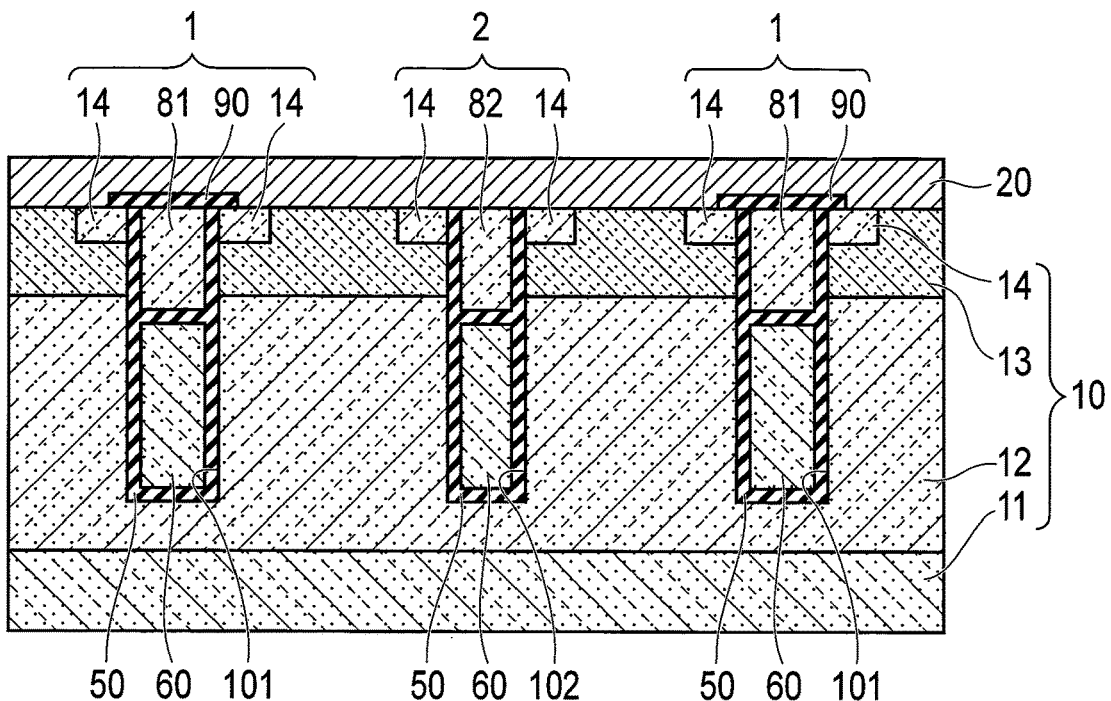
FIG. 1 is a schematic cross-sectional view illustrating the structure of a semiconductor device according to a first embodiment of the present invention.

Next, a description is given of embodiments of the present invention with reference to the drawings. In the following description of the drawings, the same of similar portions are given the same or similar reference numerals. The drawings are schematic, and it should be noted that the relationship between thickness and planar dimensions, the ratio in length of each component, and the like are different from real ones. Specific dimensions should be determined with reference to the following description. It is also obvious that dimensional relationship or proportions of some portions are different from each other between the drawings.

The following embodiments illustrate devices and methods to embody the technical idea of the present invention. The technical idea of the present invention will not specify shapes, structures, arrangement, and the like of the constituent components to those described below. The embodiment of the present invention can be variously changed within the claims.

First Embodiment

Figure 2:
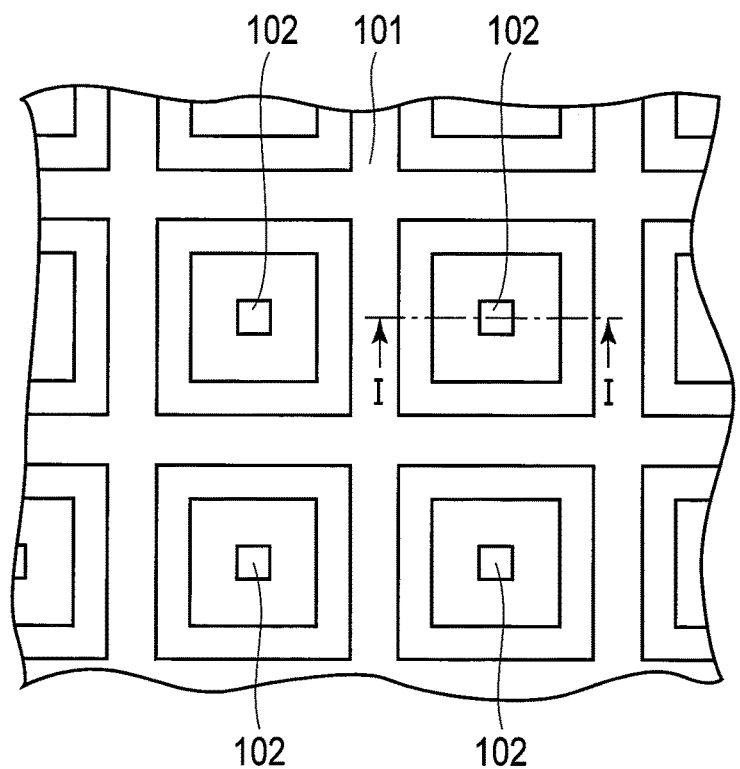
FIG. 2 is a schematic process plan view illustrating the structure of the semiconductor device according to the first embodiment of the present invention.

As illustrated in FIG. 1, a semiconductor device according to a first embodiment of the present invention includes a first semiconductor element 1 and second semiconductor elements 2 formed in a semiconductor base 10. The first semiconductor element 1 includes a first gate electrode 81 provided within a first trench 101 formed in the semiconductor base 10. The second semiconductor elements 2 includes a second gate electrode 82 provided within a second trench 102 formed in the semiconductor base 10. As illustrated in FIG. 2, the first trench 101 has a mesh-like shape in a plan view while the second trenches 102, which are columnar, are formed in mesh openings surrounded by the first trench 101. As illustrated in FIG. 2, the second trenches 102, which are rectangular in a plan view, are formed in the respective plural mesh openings. FIG. 1 is a cross-sectional view in a I-I direction of FIG. 2.

The semiconductor base 10 includes: an n-type drain region 12 provided on an n-type semiconductor substrate 11;

a p-type base region 13 provided on the drain region 12; and n-type source regions 14 provided on the base region 13. The semiconductor base 10 has a structure of silicon films laid on each other, for example. The first and second trenches 101 and 102 extending in the film thickness direction from the upper surface of the semiconductor base 10 extend from the upper surfaces of the source regions 14 and penetrate the source regions 14 and base region 13. The bottom surfaces of the first and second trenches 101 and 102 are located within the drain region 12. The source regions 14 include: first regions provided in adjacent to the opening of the first trench 101; and second regions provided in adjacent to the openings of the second trenches 102.

On the inner wall surfaces of the first and second trenches 101 and 102, trench insulating films 50 are provided. In the first and second trenches 101 and 102, vertical field plate (VFP) electrodes 60 are embedded in lower halves. The first gate electrode 81 is embedded in the upper half of the first trench 101 while the second gate electrodes 82 are embedded in upper halves of the respective second trenches 102. The VFP electrodes 60 are electrically connected to the source regions 14. Each VFP electrode 60 serves as a field plate when the semiconductor device is in the off-state and expands the depletion layer well from the bottom of the corresponding trench into the drain region 12. The first gate electrode 81 and the corresponding VFP electrode 60 are isolated and separated by insulating film.

The first gate electrode 81 is provided in a region opposite to the base region 13. The first semiconductor element 1 is thus an electric field transistor (FET) with a trench gate structure. When the first semiconductor element 1 is in the on-state, a channel is formed in the surface of the base region 13 which is opposite to the first gate electrode 81 with the trench insulating film 50 interposed therebetween. The first and second gate electrodes 81 and 82 can be made of a polysilicon film. Alternatively, the first gate electrode 81 may be made of a metallic film.

On the first gate electrode 81, an interlayer insulating film 90 is provided. On the interlayer insulating film 90, a source electrode 20, which connects to the source regions 14 and base region 13, is provided. The source electrode 20 is provided above the first gate electrode 81 with the interlayer insulating film 90 interposed therebetween.

On the other hand, the upper surfaces of the second gate electrodes 82 are in contact with the source electrode 20. The second semiconductor elements 2 are therefore MOS diodes. The direction of current flown when the second semiconductor elements 2 are in the on-state is opposite to the direction of current flown in the film thickness direction of the semiconductor base 10 when the first semiconductor element 1 is in the on-state. Such MOS diodes can reduce the forward voltage compared with pn junction diodes.

As illustrated in FIG. 2, the second trenches 102, in which the second gate electrodes 82 are provided, are provided in the respective mesh openings of the mesh-like first trench 101. Each second trench 102 is surrounded by the first gate electrode 81. In other words, the second semiconductor elements 2, which are connected to the first semiconductor element 1 in parallel, are provided in the first semiconductor element 1 arranged in a mesh-like shape.

Since the first trench 101 has a mesh-like shape in a plan view, the channel of the first semiconductor element 1 is formed in an annular shape surrounding the circumference of each mesh opening. In the structure illustrated in FIG. 2, for example, the channel of the first semiconductor element 1 is rectangular. Compared with the case where the first and second trenches 101 and 102 are arranged in stripes in a plan view as illustrated in Comparative Example in FIG. 3, the on-state resistance of the first semiconductor element 1 is reduced. The power consumption of the first semiconductor element 1 which is in the on-state is therefore reduced. In Comparative Example illustrated in FIG. 3, the first trench 101 cannot be mesh-like shaped since the second trenches 102 are arranged in stripes.

Figure 3:
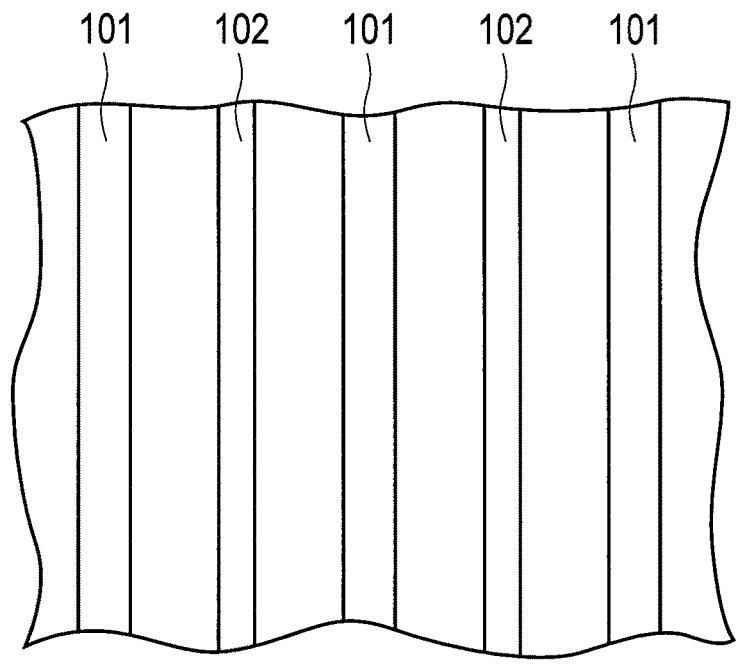
FIG. 3 is a schematic plan view illustrating the structure of a semiconductor device of Comparative Example.

Compared with Comparative Example illustrated in FIG. 3 in which the first and second trenches 101 and 102 are arranged in parallel stripes, the first semiconductor element 1 has lower parasitic capacitance since the second trenches 102 are columnar. This can increase the switching speed of the first semiconductor element 1.

As described above, according to the semiconductor device of the first embodiment, the conduction loss thereof is reduced, and the avalanche capability is improved. In addition, the switching speed is increased. Compared with Comparative Example illustrated in FIG. 3, the semiconductor device according to the first embodiment has higher density integration.

Although the mesh openings are rectangular in the example of FIG. 2, the mesh openings may have another shape. Preferably, the mesh openings are rectangular. This is because, in the process of forming the trench insulating films 50, the oxide film is easily formed when the corners of the first and second trenches 101 and 102 have 90 degrees. The trench insulating films 50 are suitably composed of an oxide film formed by thermal oxidation or the like. The rectangular mesh openings facilitate achieving even thickness of the oxide film.

Each second trench 102 is preferably formed in the center of the corresponding mesh opening. When the distance between the first and second trenches 101 and 102 is uneven, the characteristics of the semiconductor device are varied.

First Modification

Figure 4:
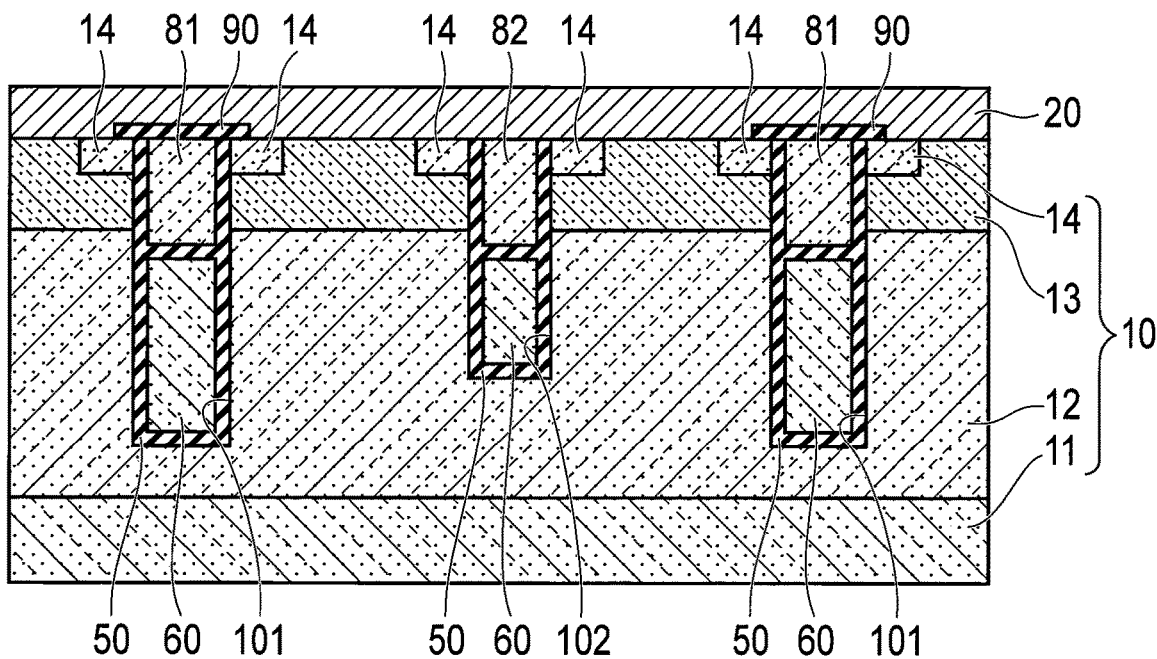
FIG. 4 is a schematic cross-sectional view illustrating the structure of a semiconductor device according to a first modification of the first embodiment of the present invention.

FIG. 4 illustrates a semiconductor device according to a first modification of the first embodiment. In the semiconductor device illustrated in FIG. 4, the distance between the upper surface of the semiconductor base 10 and the bottom surface of each second trench 102 is shorter than that between the upper surface of the semiconductor base 10 and the bottom surface of the first trench 101. This allows carriers moving from the semiconductor substrate 11 into the base region 13 to move regions under the second trenches 102. The current density is thereby reduced, and the on-state resistance is reduced.

Second Modification

Figure 5:
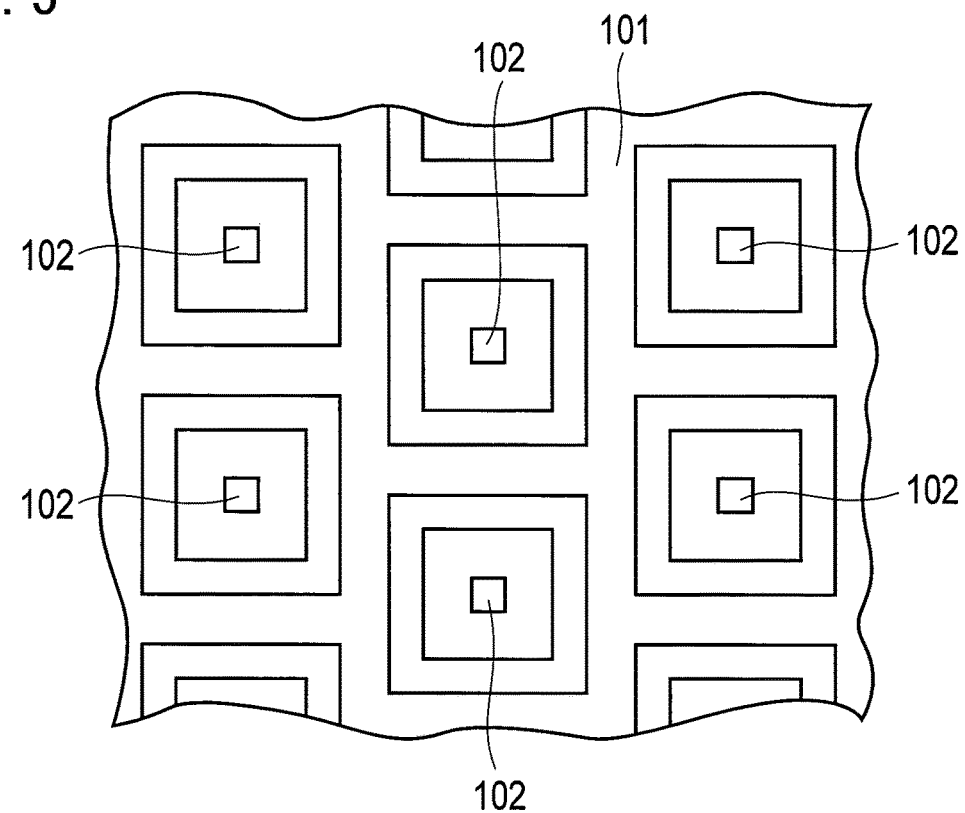
FIG. 5 is a schematic cross-sectional view illustrating the structure of a semiconductor device according to a second modification of the first embodiment of the present invention.

In the example illustrated in FIG. 2, the first trench 101 extends in a row direction and a column direction, which is perpendicular to the row direction, on the principal surface of the semiconductor base 10 and the mesh openings are arranged in a grid. However, the mesh openings may be arranged in another fashion. As illustrated in FIG. 5, for example, the first trench 101 may be formed so that the mesh openings are arranged in a staggered manner.

Second Embodiment

Figure 6:
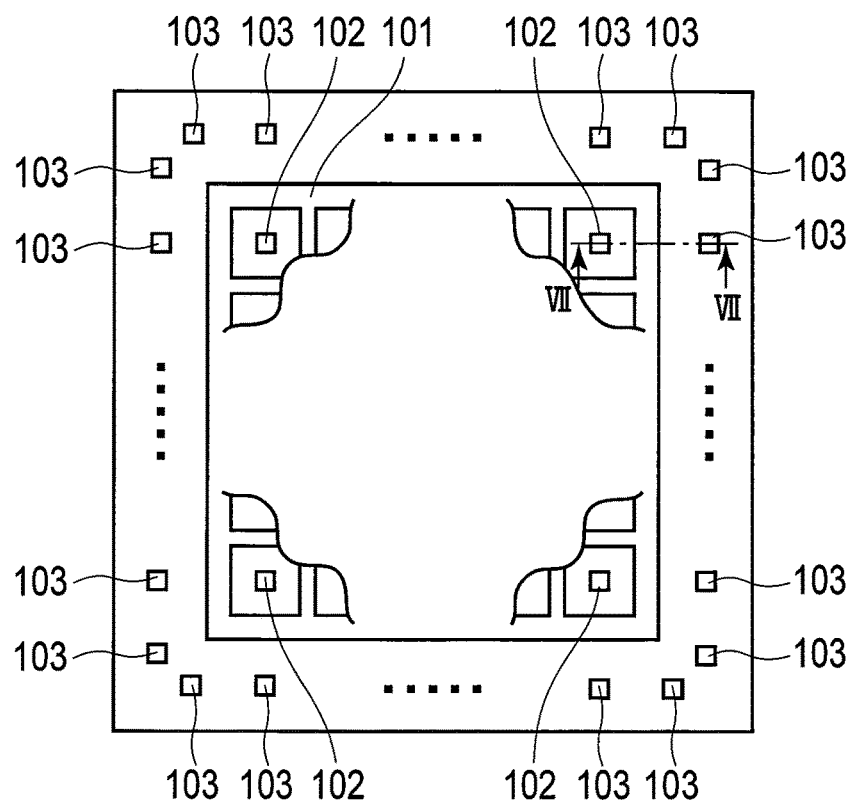
FIG. 6 is a schematic plan view illustrating the structure of a semiconductor device according to a second embodiment of the present invention.

As illustrated in FIG. 6, a semiconductor device according to a second embodiment of the present invention is different from that in FIG. 2 in that third trenches 103 are formed in the periphery of the semiconductor base 10 outside the first trench 101. The other configuration thereof is the same as that of the first embodiment.

Figure 7:
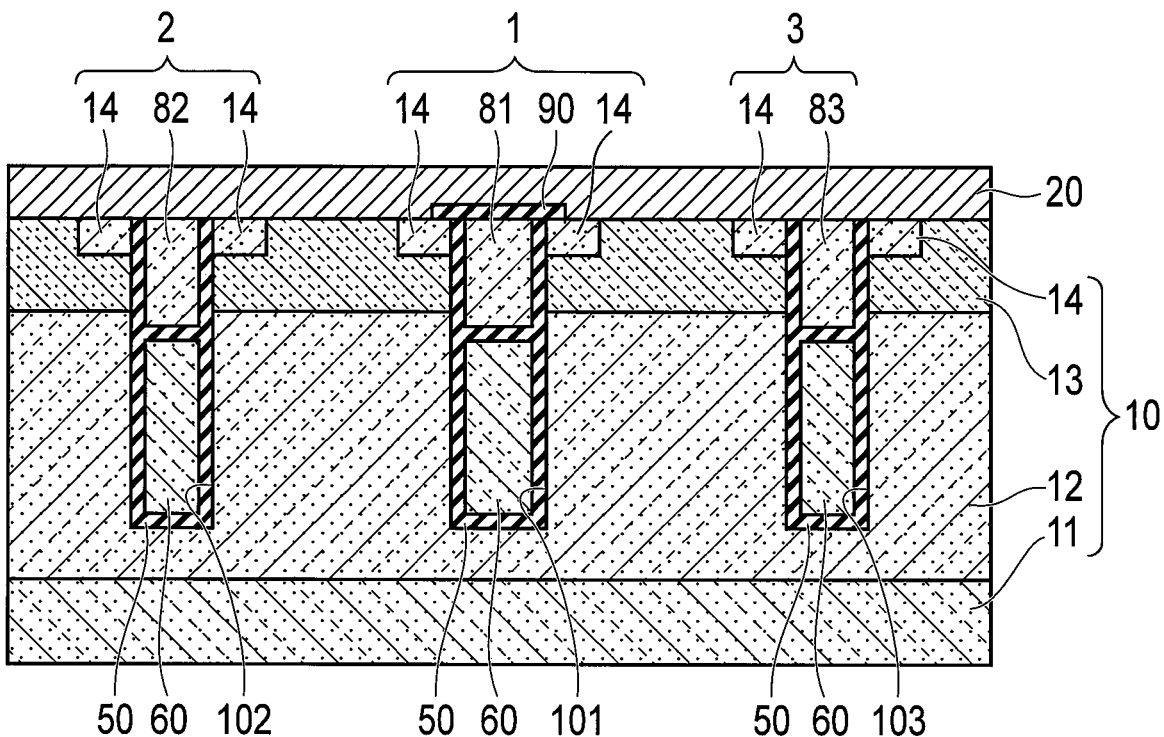
FIG. 7 is a schematic cross-sectional view illustrating the structure of the semiconductor device according to the second embodiment of the present invention.

In the semiconductor device illustrated in FIG. 6, the plural third trenches 103, which are columnar, are arranged in the periphery of the semiconductor base 10 so as to separate from each other. FIG. 7 illustrates a cross-sectional view along a VII-VII direction of FIG. 6.

As illustrated in FIG. 7, a third gate electrode 83 is provided within each third trench 103, and third semiconductor elements 3 are formed in the periphery of the semiconductor base 10. The third semiconductor elements 3 are MOS diodes of the same structure as that of the second semiconductor elements 2. Specifically, each third trench 103 extends from the upper surface of the corresponding source region 14 and penetrates the source region 14 and base region 13, and the bottom surface thereof is located in the drain region 12. On the inner wall surface of the third trench 103, the trench insulating film 50 is provided. In the third trench 103, the VFP electrode 60 is embedded in the lower half, and the third gate electrode 83 is embedded in the upper half. The upper surface of the third gate electrode 83 is in contact with the source electrode 20.

Providing semiconductor elements with large operating current, such as transistors, in the periphery of the semiconductor base 10 could cause some problems, including reduction in avalanche capability. The periphery of the semiconductor base 10 is therefore a region in which transistors cannot be provided. However, in the case of providing diodes with relatively small operating current in the periphery of the semiconductor base 10, the reduction of the avalanche capability does not matter.

The second semiconductor elements 2 and the third semiconductor elements 3 are connected in parallel, so that the current density of the whole semiconductor device is reduced. When the first semiconductor element 1 is in the on-state, large current flows in the central region of the semiconductor device. When the first semiconductor element 1 is in the off-state, regenerating current flows through the second and third semiconductor elements 2 and 3.

In the semiconductor device illustrated in FIG. 7, therefore, provision of the third semiconductor elements 3 in the periphery enables efficient use of the periphery of the semiconductor base 10 and reduces the current density of the whole semiconductor device. This enhances the reliability of the semiconductor device.

According to the semiconductor device of the second embodiment, the semiconductor elements are provided also in the periphery of the semiconductor base 10. This enables efficient use of the entire surface of the semiconductor device. The other matters are substantially the same as those of the first embodiment, and the redundant description thereof is omitted.

As described above, according to the semiconductor device of the second embodiment, the switching speed and avalanche capability are improved while the current density of the whole semiconductor device is reduced.

First Modification

Figure 8:
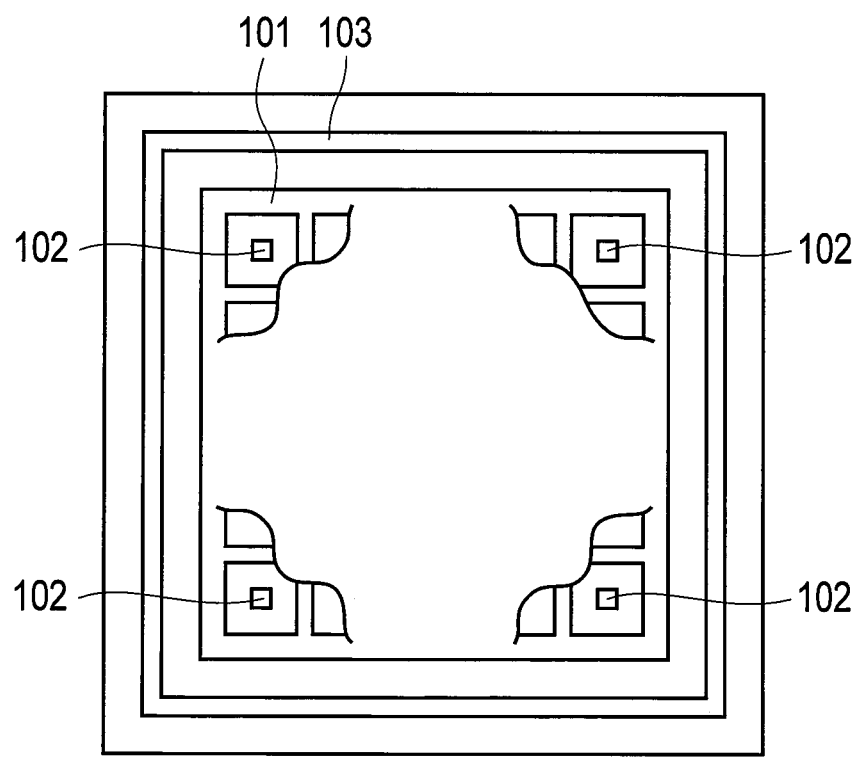
FIG. 8 is a schematic plan view illustrating the structure of a semiconductor device according to a first modification of the second embodiment of the present invention.

FIG. 8 illustrates a semiconductor device according to a first modification of the second embodiment of the present invention. In the semiconductor device illustrated in FIG. 8, the third trenches 103 may include a third trench 103 which is formed in an annular shape in a plan view in the periphery of the semiconductor base 10 so as to surround the circumference of the first trench 101. In such a manner, the third trenches 103, which are provided outside the first trench 101, do not need to be columnar as illustrated in FIG. 6.

In the example of the semiconductor device illustrated in FIG. 8, the single third trench 103 surrounds the circumference of the first trench 101. However, the third trench 103 may include plural annular third trenches 103. For example, the plural third trenches 103 include two or three third trenches 103 that surround the circumference of the first trench 101.

Second Modification

Figure 9:
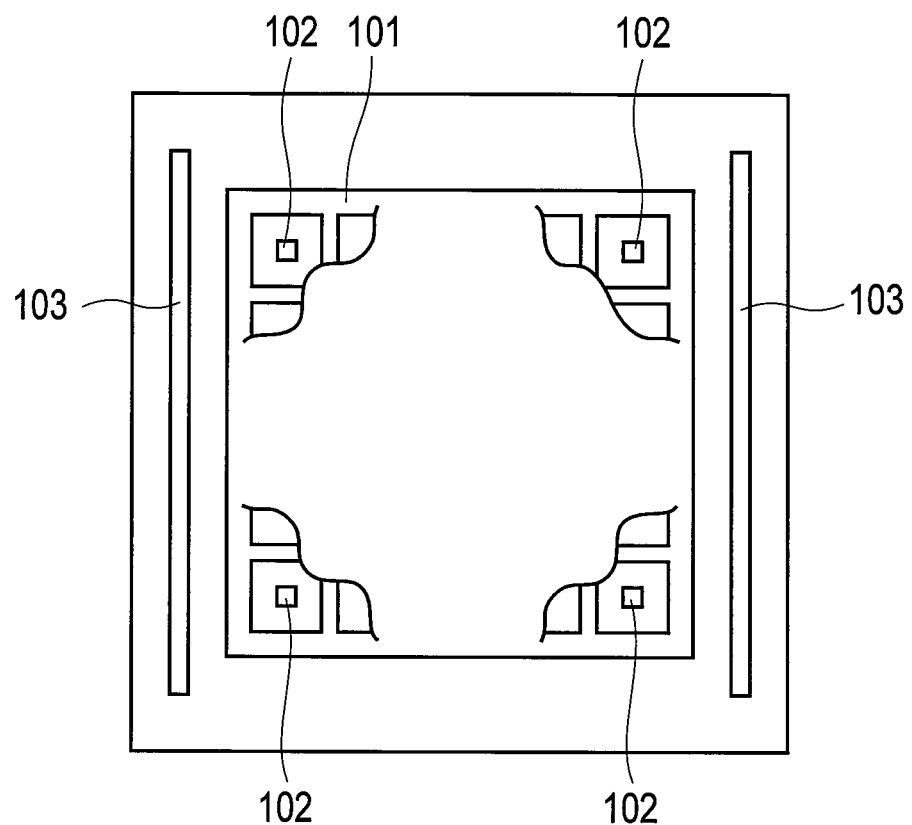
FIG. 9 is a schematic plan view illustrating the structure of a semiconductor device according to a second modification of the second embodiment of the present invention.

FIG. 9 illustrates a semiconductor device according to a second modification of the second embodiment of the present invention. In the semiconductor device illustrated in FIG. 9, the third trench 103 may include third trenches 103 formed in stripes outside the first trench 101. In the example illustrated in FIG. 9, the third trenches 103 are provided on the right and left sides of the first trench 101 in the drawing, but one of the third trenches 103 may be provided on the right or left side. The third trenches 103 may be provided on upper and lower sides of the first trench 101. Alternatively, the third trenches 103 may include plural third trenches 103 provided next to each other in parallel.

Other Embodiment

As described above, the present invention is illustrated by the embodiments. However, it should not be understood that the description and drawings constituting a part of the disclosure limit the present invention. Based on the disclosure, those skilled in the art will appreciate various substitutions, examples, and operation techniques.

The explanation of the already described embodiments illustrates the case where the first semiconductor element 1 is an FET, for example. However, the present invention is applicable to other semiconductor devices with a trench gate structure. The present invention is applicable to the case where the first semiconductor element 1 is an insulated gate bipolar transistor (IGBT), for example.

In the examples illustrated in the above description, the VFP electrodes 60 are formed in lower halves of the first to third trenches 101 to 103. However, each gate electrode may be embedded so as to fill the entire corresponding trench.

As described above, it is obvious that the present invention includes various embodiments not described herein and the like. The technical scope of the present invention is determined only by the features according to the claims proper from the above description.

INDUSTRIAL APPLICABILITY

The semiconductor device of the present invention is applicable to semiconductor devices with a trench gate structure.

The invention claimed is:
1. A semiconductor device, comprising:
    a semiconductor base in which a first trench is formed in a mesh-like shape in a plan view and a second trench is formed in a mesh opening surrounded by the first trench;
    a first semiconductor element which is formed in the semiconductor base and includes a first gate electrode provided within the first trench; and a second semiconductor element which is formed in the semiconductor base and includes a second gate electrode provided within the second trench surrounded by the first gate electrode, wherein a distance between an upper surface of the semiconductor base in which openings of the first and second trenches are formed and a bottom surface of the second trench is shorter than a distance between the upper surface of the semiconductor base and a bottom surface of the first trench.

2. The semiconductor device according to claim 1, wherein the first semiconductor element is a transistor; and a direction that a current flows when the second semiconductor element is in an on-state is opposite to a direction that a current flows in a film thickness direction of the semiconductor base when the first semiconductor element is in an on-state.

3. The semiconductor device according to claim 1, wherein the mesh opening is comprised in a plurality of mesh openings, and the second trench is comprised in a plurality of columnar second trenches which are provided in the respective mesh openings.

4. The semiconductor device according to claim 1 wherein the semiconductor base includes:

a drain region;

a base region provided on the drain region; and source regions which are provided on the base region and include: a first region provided adjacent to an opening of the first trench; and a second region provided adjacent to an opening of the second trench, and the first and second trenches extend from upper surfaces of the respective source regions and penetrate the source regions and the base region, the semiconductor base further includes:

an interlayer insulating film provided on the first gate electrode; and a source electrode which is provided on the upper surfaces of the base region, the source regions, and the second gate electrode and is provided above the first gate electrode with the interlayer insulating film interposed therebetween.

5. The semiconductor device according to claim 1, wherein the mesh opening is rectangular in a plan view.

6. A semiconductor device comprising:

a semiconductor base in which a first trench is formed in a mesh-like shape in a plan view and a second trench is formed in a mesh opening surrounded by the first trench;

a first semiconductor element which is formed in the semiconductor base and includes a first gate electrode provided within the first trench; and a second semiconductor element which is formed in the semiconductor base and includes a second gate electrode provided within the second trench surrounded by the first gate electrode, wherein a third trench is formed outside the first trench in a plan view, the semiconductor device further comprising:

a third semiconductor element including a third gate electrode provided within the third trench.

7. The semiconductor device according to claim 6, wherein the third trench includes a plurality of columnar third trenches which are separated from each other in a plan view.

8. The semiconductor device according to claim 6, wherein the third trench has an annular shape in a plan view so as to surround a circumference of the first trench.

9. The semiconductor device according to claim 6, wherein the third trench has a stripe shape parallel to a side of the first trench in a plan view.

* * * * *